US012751102B2

(12) United States Patent
Zheng et al.

(10) Patent No.: US 12,751,102 B2
(45) Date of Patent: Sep. 29, 2026

(54) PHOTODIODE WITH DEEP TRENCH ISOLATION STRUCTURES

(71) Applicant: GlobalFoundries Singapore Pte. Ltd., Singapore (SG)

(72) Inventors: Ping Zheng, Singapore (SG); Eng Huat Toh, Singapore (SG); Kiok Boone Elgin Quek, Singapore (SG); Cancan Wu, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 615 days.

(21) Appl. No.: 18/455,320

(22) Filed: Aug. 24, 2023

(65) Prior Publication Data

US 2025/0072149 A1 Feb. 27, 2025

(51) Int. Cl.
*H10F 39/00* (2025.01)
*H10F 39/18* (2025.01)

(52) U.S. Cl.
CPC ......... *H10F 39/807* (2025.01); *H10F 39/024* (2025.01); *H10F 39/18* (2025.01); *H10F 39/8057* (2025.01)

(58) Field of Classification Search
CPC ....... H10F 39/807; H10F 39/18; H10F 39/024
USPC .......................................................... 257/432
See application file for complete search history.

(56) References Cited

U.S. PATENT DOCUMENTS

| | | | | |
|---|---|---|---|---|
| 9,160,949 | B2 | 10/2015 | Zhang et al. | |
| 2022/0005849 | A1* | 1/2022 | Zang | H10F 39/8053 |
| 2022/0020789 | A1* | 1/2022 | Otake | H10F 39/8057 |
| 2024/0371899 | A1* | 11/2024 | Yamazaki | H10F 39/8063 |

OTHER PUBLICATIONS

Kazuhiro Morimoto et al., "High Fill-factor Miniaturized SPAD Arrays With a Guard-ring-sharing Technique", Optics Express, Apr. 27, 2020, pp. 13068-13080, vol. 28, No. 9, https://doi.org/10.1364/OE.389216.

K. Ito et al., "A Back Illuminated 10μm SPAD Pixel Array Comprising Full Trench Isolation and Cu—Cu Bonding with Over 14% PDE at 940nm", International Electron Devices Meeting (IEDM), Dec. 12-18, 2020, p. 16.6.1-4., IEEE.

* cited by examiner

*Primary Examiner* — Xia L Cross

(57) ABSTRACT

A photodiode device includes a layer of semiconductor material, a plurality of pixels, each of the pixels including a diode structure on a first side of the layer of semiconductor material and a conductive layer on a second side of the layer of semiconductor material, deep trench isolation (DTI) structures isolating adjacent pixels from one another, a first vertical conductive layer over a first side of each DTI structure, and a second vertical conductive layer over a second side of each DTI structure. The first vertical conductive layer extends from the conductive layer to a first contact on the first side of each DTI structure, and the second vertical conductive layer extends from the conductive layer to a second contact on the second side of each DTI structure.

20 Claims, 6 Drawing Sheets

PHOTODIODE WITH DEEP TRENCH ISOLATION STRUCTURES

BACKGROUND

Photodetectors are sensors that detect the presence of electromagnetic radiation. Semiconductor photodiodes are a category of photodetectors that use a P-N diode to convert incident photons into current. Photodiodes are used by many different technologies to sense one or more frequency of light, to determine the time at which transmitted light is reflected back to the photodiode, etc.

Avalanche photodiodes are a highly biased photodiodes in which photo-generated carriers are multiplied by avalanche breakdown in the device. Single photon avalanche diodes (SPADs) are avalanche photodiodes which are sensitive enough to detect the incidence of a single photon, and have lower noise and jitter than typical photodiodes. As technology progresses, there is an increasing demand for further miniaturization and improvements to photodiode technology.

SUMMARY

Embodiments of the present disclosure are directed to a photodiode, a photodetector, and a method for forming a photodiode.

In an embodiment, a photodiode device includes a layer of semiconductor material, a plurality of pixels, each of the pixels including a diode structure on a first side of the layer of semiconductor material and a conductive layer on a second side of the layer of semiconductor material, deep trench isolation (DTI) structures isolating adjacent pixels from one another, a first vertical conductive layer over a first side of each DTI structure, and a second vertical conductive layer over a second side of each DTI structure. The first vertical conductive layer extends from the conductive layer to a first contact on the first side of each DTI structure, and the second vertical conductive layer extends from the conductive layer to a second contact on the second side of each DTI structure.

In an embodiment, a photodetector includes a control circuit and a photodiode device which comprises a layer of semiconductor material, a pixel including a diode structure on a first side of the layer of semiconductor material and a conductive layer on a second side of the layer of semiconductor material, a deep trench isolation (DTI) structure surrounding the pixel, a first vertical conductive layer over a first side of each DTI structure, and a second vertical conductive layer over a second side of each DTI structure. The first vertical conductive layer extends from the conductive layer to a first contact on the first side of each DTI structure, and the second vertical conductive layer extends from the conductive layer to a second contact on the second side of each DTI structure.

In an embodiment, a method of forming a photodiode device including a plurality of pixels includes forming, on a substrate comprising a layer of conductive material and a layer of semiconductor material, a first vertical conductive layer and a second vertical conductive layer that extend through the layer of conductive material and the layer of semiconductor material, forming a diode structure on a first side of the layer of semiconductor material, and forming a deep trench isolation (DTI) structure between the first and second vertical conductive layers, the DTI structure isolating the diode structure from an adjacent diode structure. The first vertical conductive layer extends from the conductive layer to a first contact on the first side of the DTI structure, and the second vertical conductive layer extends from the conductive layer to a second contact on the second side of the DTI structure.

DETAILED DESCRIPTION

A detailed description of embodiments is provided below along with accompanying figures. The scope of this disclosure encompasses numerous alternatives, modifications and equivalents. Although steps of various processes are presented in a particular order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Although the terms "first" and/or "second" may be used herein to describe various elements, these elements should not be limited by these terms. These terms may be used merely to distinguish one element from another element. For instance, a first element discussed below could be termed a second element without departing from the teachings of the present disclosure. Similarly, the second element could also be termed the first element.

The drawings are not necessarily to scale and in some instances, proportions may have been exaggerated to clearly illustrate features of the embodiments. When a first element is referred to as being "on" a second element or "on" a substrate, it not only refers to a case where the first element is formed directly on the second element or the substrate but also a case where a third element exists between the first element and the second element or the substrate. An element "connected" or "coupled" to or with another element may be directly connected or coupled to or with the other element or, instead, one or more intervening elements may be present.

Figure 1A:
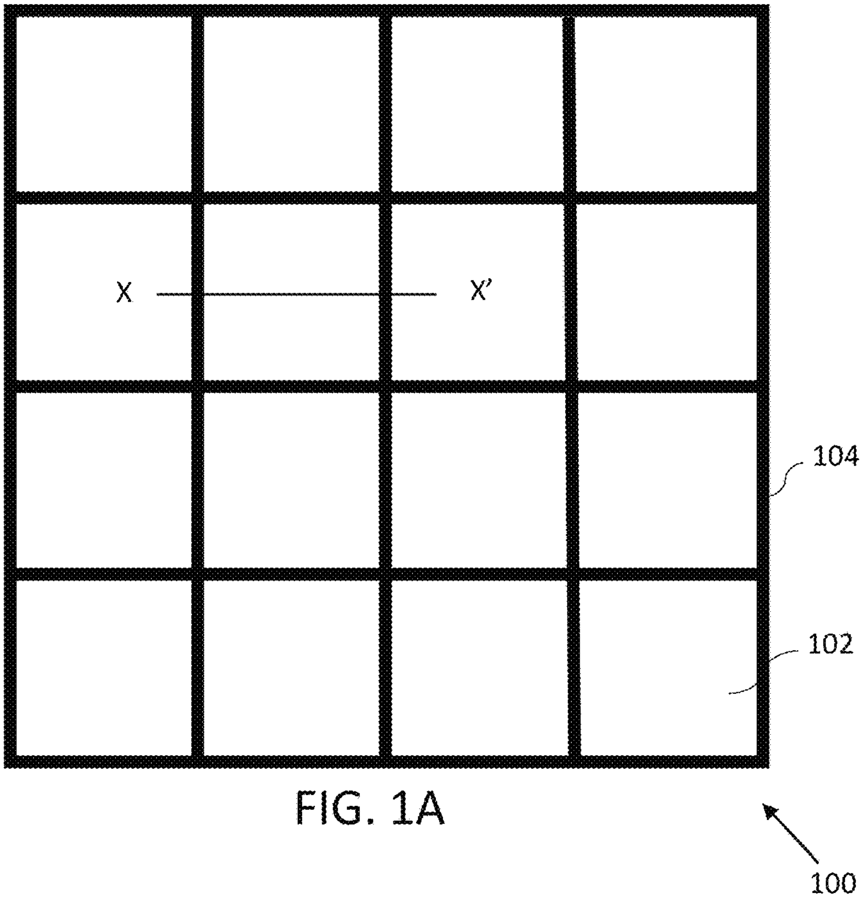
FIG. 1A illustrates a schematic diagram of a photodiode according to an embodiment.
Figure 1B:
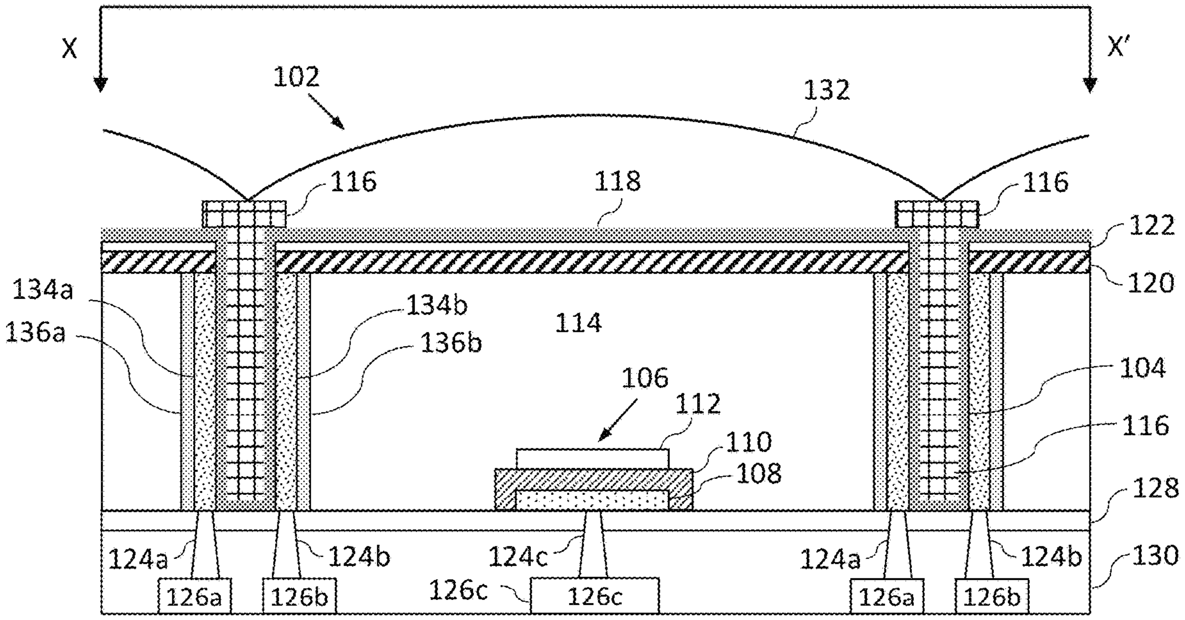
FIG. 1B illustrates a simplified cross-sectional view of the photodiode of FIG. 1A according to an embodiment.

FIG. 1A illustrates a photodiode device 100 according to an embodiment of the present disclosure. The device 100 illustrated by FIGS. 1A and 1B is a backside illuminated (BSI) single photon avalanche diode (SPAD) photodiode device, but in other embodiments, the photodiode device can be an avalanche photodiode (APD) device, for example.

An APD is a type of photosensitive semiconductor device in which light is converted to electricity due to the photoelectric effect coupled with electric current multiplication as a result of avalanche breakdown. APDs differ from conventional photodiodes in that incoming photons internally trigger a charge avalanche. APDs can measure low levels of light and are widely used in long-distance optical communications and optical distance measurement where high sensitivity is needed.

SPADs are a type of APD that is sensitive enough to detect the incidence of a single photon. SPADs trigger an avalanche phenomenon with respect to the incidence of a single photon by applying a bias voltage higher than the breakdown voltage, and output a corresponding voltage pulse. The diode of an SPAD may employ a wide band-gap semiconductor material such as SiC, GaN, GaAs, AlN, AlAs, BN, GaP, AlP, ZnTe, MnTe, MgTe, ZnS, MgS, HgS, PbI2, TlPbI3, TlBr, TlBrI, or InAlP. In other embodiments, the SPAD may employ narrow band gap materials such as Ge, InGaAs, etc.

Returning to FIG. 1A, the photodiode device 100 has a plurality of pixels 102 that are separated by deep trench isolation (DTI) structures 104. The DTI structures 104 isolate the pixels 102 to prevent crosstalk between adjacent pixels. The photodiode device 100 may have any number of pixels 102 that define the resolution of the photodiode device 100. For example, when the photodiode device 100 is used in an image sensor, the device may have millions of pixels on a single chip, while a photodiode device 100 for a light detection and ranging (LiDAR) device may have only a few hundred or a few thousand pixels.

FIG. 1B illustrates cross-section X-X' of a pixel 102 of the photodiode device 100 illustrated in FIG. 1A. Each pixel 102 in the device includes a diode structure 106 on a first side of the substrate. The diode structures 106 include a first highly doped region 108 that may be doped with a first type of dopants, e.g. N dopants, a first well 110 that is doped with the first type of dopants and adjacent to the first doped region 108, and a second doped well 112 adjacent to the first doped well 110 and doped with a second type of dopants, e.g., P dopants. In another embodiment, the diode 106 has a first doped region 108 and a second doped well 112, and does not include the first well 110.

The diode structure 106 is disposed in a semiconductor material 114 that may be doped with the second type of dopants. When the first type of dopants are N dopants, the second type of dopants are P dopants. In such an embodiment, doped region 108 may be an N+ doped region, first doped well 110 may be an N well, second doped well 112 may be a P well. The semiconductor material 114 may be an intrinsic material without any doping, or a lightly doped material. The semiconductor material may be an epitaxial silicon material, or another semiconductor material such as germanium. Accordingly, the doped region 108, first doped well 110 and second doped well 112 may be doped silicon or doped germanium structures. The diode structure 106 may be formed of the same semiconductor material as semiconductor material 114 or a different material.

The diode structure 106 is surrounded by DTI structures 104. The DTI structures 104 include a conductive material 116 disposed in a center portion of the structures, and the sidewalls and base of the trenches are lined with an insulating liner layer 118. The conductive material 116 may be a metal material such as tungsten, aluminum or copper, or a highly doped semiconductor material. The insulating liner layer 118 may be an oxide material such as silicon oxide or aluminum oxide.

An anti-reflective coating (ARC) layer 122 is disposed over a conductive layer 120 on a second side of the substrate which is a light-facing side of the device, and a micro-lens 132 is disposed over the anti-reflective coating layer 122. The anti-reflective coating layer 122 may be an oxide material such as titanium oxide, or a similar material as known in the art. A passivation layer (not shown), e.g. an aluminum oxide layer, may be present on the anti-reflective coating layer 122.

The conductive layer 120 may be a buried doped layer that is doped with the first type of dopants that are the same type of dopants as semiconductor material 114. The micro-lens 132 may focus photons toward the diode structure 106, and may be formed of a polymer or fused silica material.

The conductive layer 120 has a higher doping than semiconductor material 114 and is disposed on an opposite side of the semiconductor material 114 from the diode structure 106. In an embodiment in which the first type of dopants are N dopants and the second type are P dopants, the conductive layer 120 is part of an anode pickup of the photodiode device 100.

In another embodiment, the first dopants are P dopants and the second dopants are N dopants. In such an embodiment, the doped region 108 may be a P+ doped region, doped well 110 may be a P-well, doped well 112 may be an N-well, and the semiconductor material 114 may be a depleted epitaxial silicon or N-doped silicon. In such an embodiment, conductive layer 120 may be a buried N-doped layer, and the conductive layer 120 is a cathode pickup or cathode electrode of the device 100. Accordingly, the conductive layer 120 may be an anode electrode or a cathode electrode of the device 100 in different embodiments.

A first vertical conductive layer **134*a* is on a first side of each DTI structure 104, and a second vertical conductive layer 134*b* is on a second side of the DTI structure. The vertical conductive layers 134 may be located directly against the insulating liner layer 118 of the DTI structures 104. In another embodiment, a liner layer may be present between the vertical conductive layers 134 and the insulating liner layers 118**.

The vertical conductive layers **134*a* and 134*b* may be doped semiconductor materials that have the same dopant type as conducive layer 120. For example, when conducive layer 120 is P-doped, the vertical conductive layers 134 are also P-doped, and when conducive layer 120 is N-doped, the vertical conductive layers 134** are also N-doped.

In some embodiments, the vertical conductive layers have a doping concentration from 1E17 to 1E21 atoms/$cm^3$. The semiconductor material of vertical conductive layers **134*a* and 134*b*** may be polysilicon. In other embodiments, the semiconductor material may be epitaxial silicon, germanium, or other semiconductor materials as known in the art.

The conductive material of vertical conductive layers **134*a* and 134*b* is not limited to a doped semiconductor material. In some embodiments, the vertical layers 134*a* and 134*b*** are a metal material such as tungsten or copper.

First ends of vertical conductive layers **134*a* and 134*b* are respectively coupled to first and second metal lines 126*a* and 126*b* through first and second contacts 124*a*, and second ends of vertical conductive layers 134*a* and 134*b* are coupled to conductive layer 120. Accordingly, the first and second vertical conductive layers 134*a* and 134*b* illustrated in FIG. 1**B are part of anode or cathode pickups for a photodiode.

Also shown in the embodiment of FIG. 1B is a first oxide liner layer 136*a* over the first vertical conductive layer 134*a*, and a second oxide liner layer 136*b* over the second vertical conductive layer 134*b*. The first and second oxide liner layers 136*a* and 136*b* may be a semiconductor oxide material such as silicon oxide, although other materials are possible. The oxide layers reduce series resistance (parasitic resistance) of the pixel 102. The oxide liner layers 136 may have a width of from 50 to 100 nm, for example.

The embodiment in FIG. 1B has several advantages over a conventional design. In a conventional design, metal lines are coupled to doped regions on the diode side of the pixel instead of vertical conductive layers. The doped regions occupy a significant amount of space in the lateral dimension. The vertical conductive layers of the present disclosure occupy substantially less space on the substrate, so it is possible to achieve higher pixel density using the same diode size as a conventional design, or a higher fill factor using the same pixel size as a conventional design. Another advantage of embodiments of the present disclosure is lower resistance since the vertical conductive layers extend between the contacts 126 and conductive layer 120.

The contacts 124 and metal lines 126 are part of a circuit structure of the photodiode device 100. The circuit structure may include circuitry for biasing the diode structure 106 and detecting voltage pulses caused by the incidence of photons. Collectively, the metal lines 126*a/b*, contacts 124*a/b*, vertical conductive layers 134*a/b* and conductive layer 120 may provide an anode structure or a portion of an anode circuit of the photodiode 100.

The contacts 124 extend through, or penetrate, an etch stop layer 128 and a portion of an interlayer dielectric layer 130. The contacts 124 may be a metal material or a doped semiconductor, and the metal lines 126*b* may be tungsten, for example. The etch stop layer 128 may be a nitride or oxide material, and the interlayer dielectric layer 130 may be an oxide material such as silicon oxide.

Figure 2A:
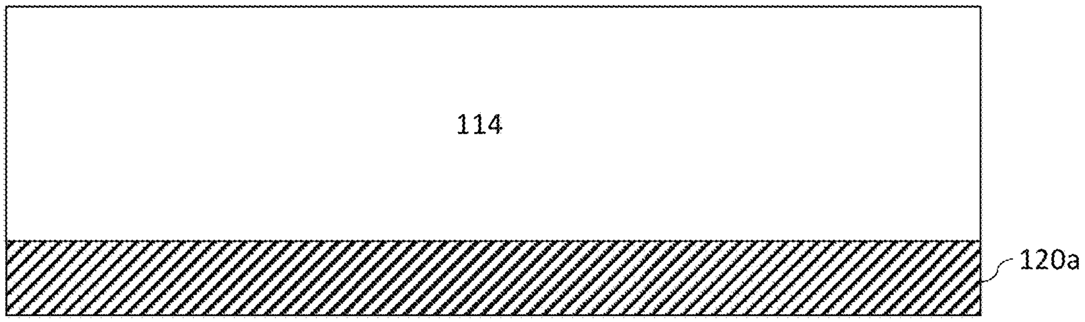
FIGS. 2A-2I illustrate simplified cross-sectional views of a process of forming the photodiode of FIG. 1B according to an embodiment.

A first embodiment of a process of forming a photodiode device 100 will now be explained with respect to FIGS. 2A-2I. As illustrated in FIG. 2A, a process of forming a photodiode device 100 may start with a semiconductor substrate including a semiconductor material 114 on one side of the substrate and a conductive material 120*a*, e.g. a doped semiconductor material, on the other side of the substrate. In an embodiment, the semiconductor material 114 is an epitaxial silicon material that is formed on the conductive material 120*a* using an epitaxial growth process, but other embodiments are possible.

Figure 2B:
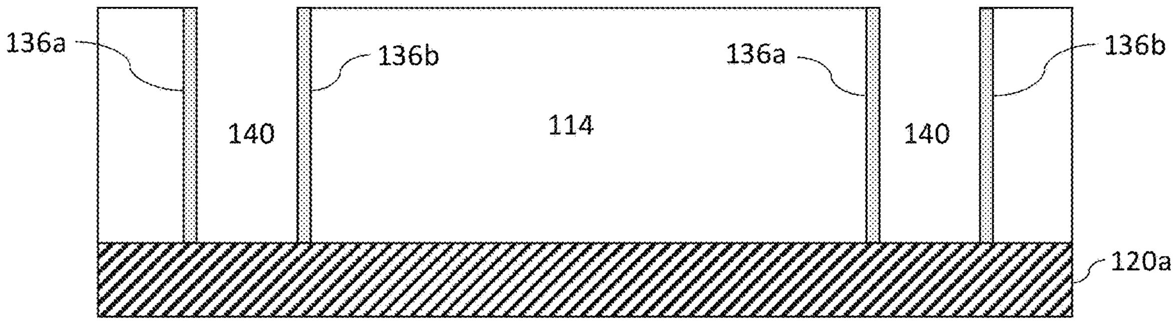

An etch mask is deposited over the semiconductor material 114 and trenches 140 are formed by etching the semiconductor material 114 using the etch mask. Oxide liner layers 136*a* and 136*b* may be formed, for example, by depositing an oxide material using a chemical vapor deposition (CVD) process and removing oxide from the upper surface of the semiconductor material 114 and lower surfaces of the trenches 140 using an anisotropic etch. The resulting structure, in which sidewalls of trenches 140 are covered with oxide liner layers 136, is shown in FIG. 2B.

Figure 2C:
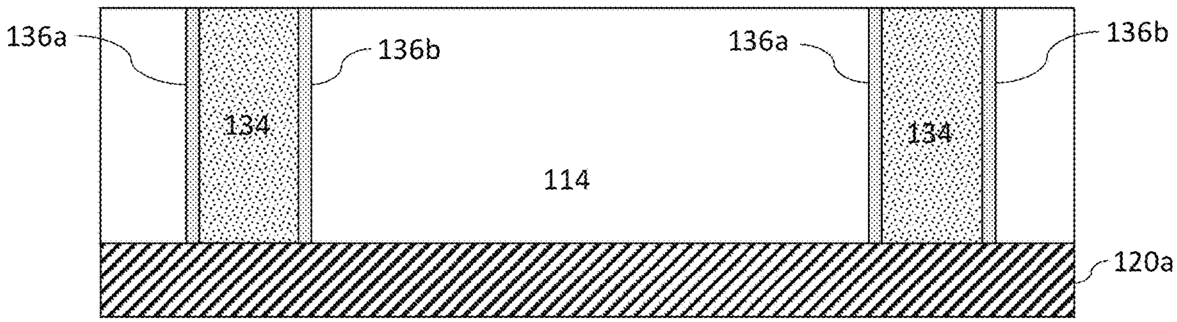
Figure 2D:
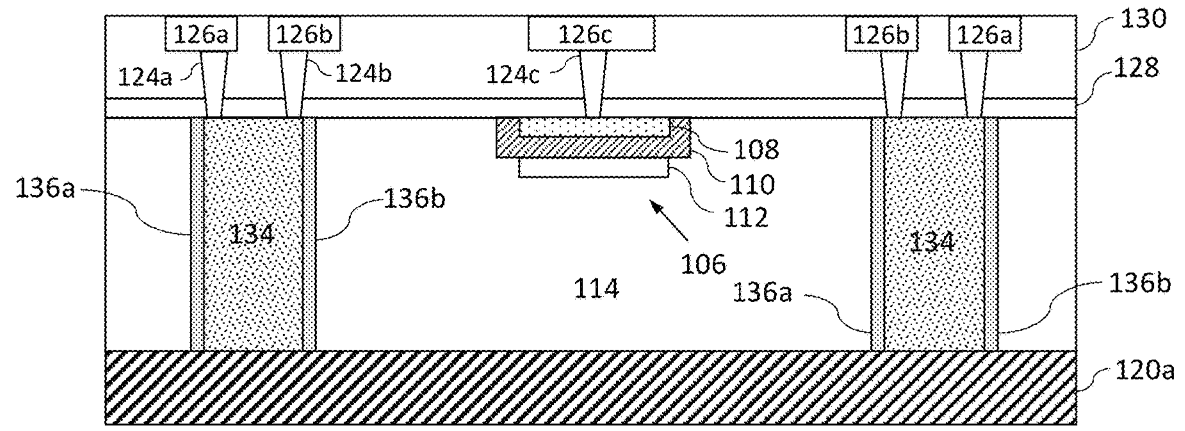
Figure 2E:
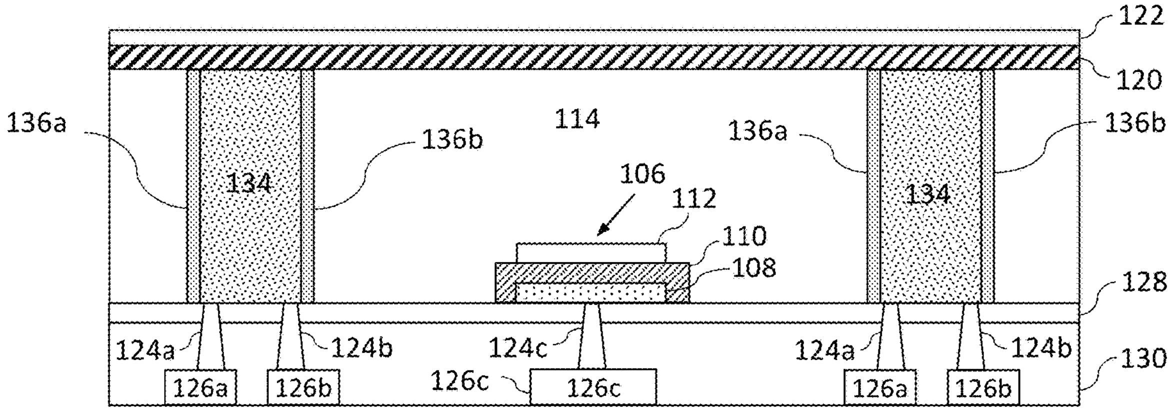
Figure 2F:
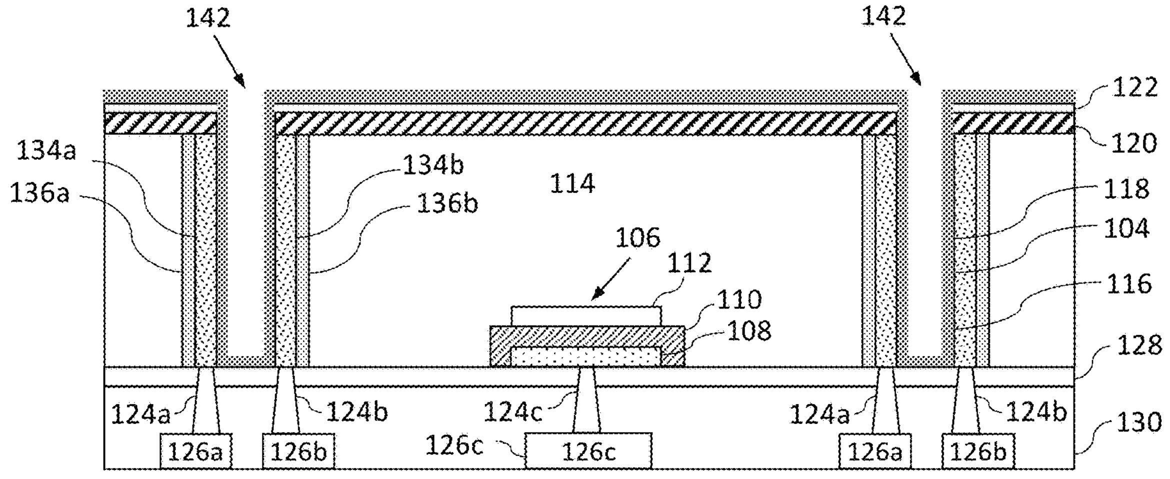

Subsequently, the trenches 140 are filled with a conductive material 134 using a damascene process to form the structure shown in FIG. 2C. As noted above, the conductive material 134 may be a metal material or a doped semiconductor material. In an embodiment in which the conductive material 134 is a doped semiconductor material, the conductive material may be formed using an in-situ doping process. In another embodiment, an undoped semiconductor material is deposited over the substrate to fill the trenches 140, a leveling operation such as a CMP process is performed, a mask pattern is formed to expose the semiconductor material in the trenches, the semiconductor material is doped using the mask pattern to form conductive material 134.

The diode structure 106 is formed by performing a series of masking and doping processes as known in the art, and an etch stop layer 128 and a dielectric layer are formed over the diode structure 106. The etch stop layer 128 and dielectric layer are etched using a mask pattern, and a conductive material is deposited and leveled to form first and second contacts 124*a* and 124*b* on opposite sides of the conductive material 134. Third contact 126*c*, which is coupled to diode structure 106, is formed by the same process.

First, second and third metal lines 126*a*, 126*b* and 126*c* are respectively formed over first, second and third contacts 124*a*, 124*b* and 126*c*. The metal lines 126 are disposed in a dielectric material of interlayer dielectric layer 130. Additional conductive and dielectric structures are formed over dielectric layer 130 to form BEOL structures as known in the art.

The wafer is flipped to expose the doped silicon substrate 120*a*, and a thinning operation is performed to form conductive layer 120 with an appropriate thickness. The thinning operation may be an etch-back operation or a backgrinding operation. The anti-reflective coating layer 122 is formed over the thinned conductive layer 120, e.g. by a vapor deposition process, to form the structure shown in FIG. 2E.

Next, trenches 142 are formed around diode structure 106. The trenches 142 may be formed by patterning a photoresist layer and performing an etch process in which the etch stop layer 128 and contacts 124 are used as etch stop materials. When trenches 142 are etched, first and second vertical conductive layers 134*a* and 134*b* are formed on opposite sides of the trenches from the remaining portions of conductive material 134. An insulation liner material 118 is deposited over exposed surfaces of the entire structure, including sidewalls and bases of the trenches 140 and the exposed surfaces of ARC layer 122 to form the structure shown in FIG. 2F.

Figure 2G:
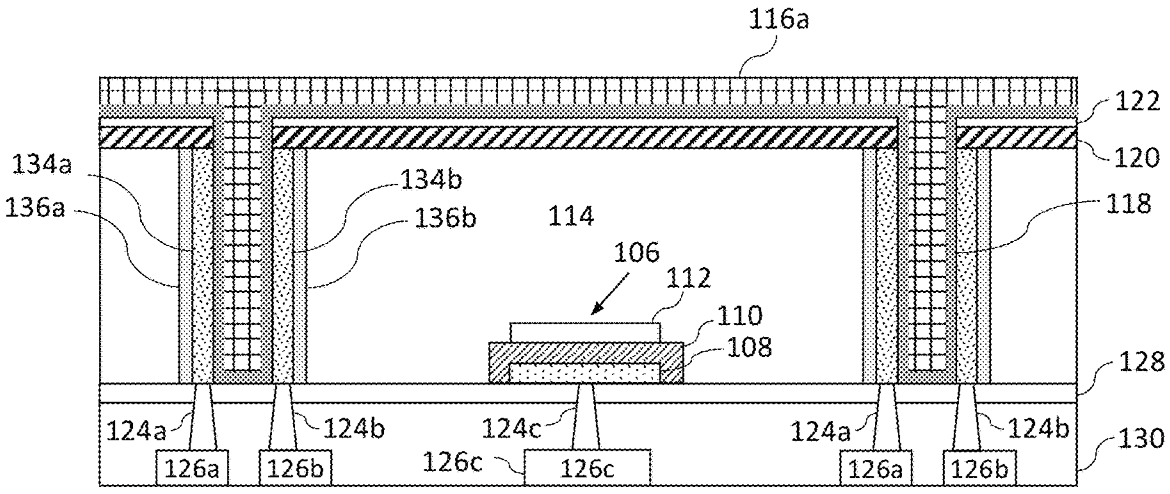
Figure 2H:
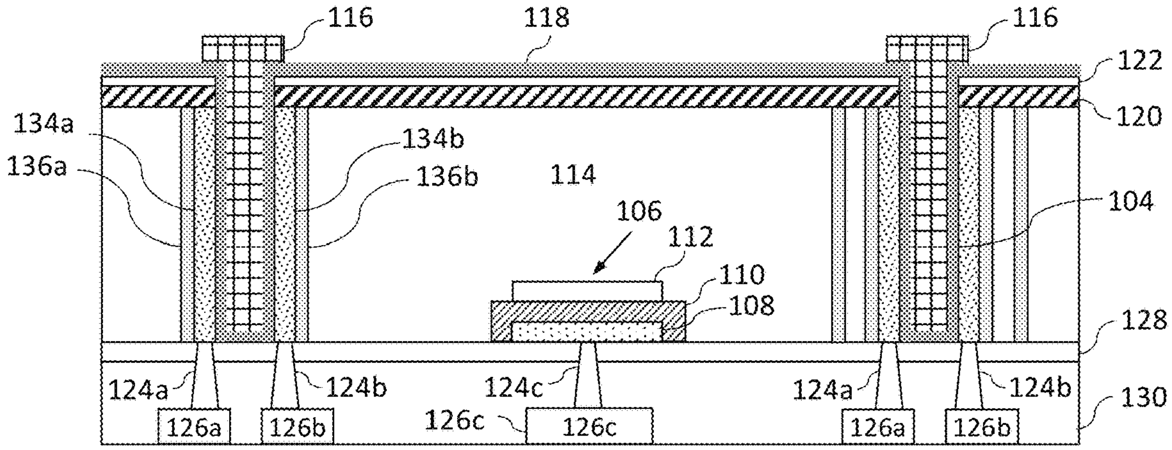
Figure 2I:
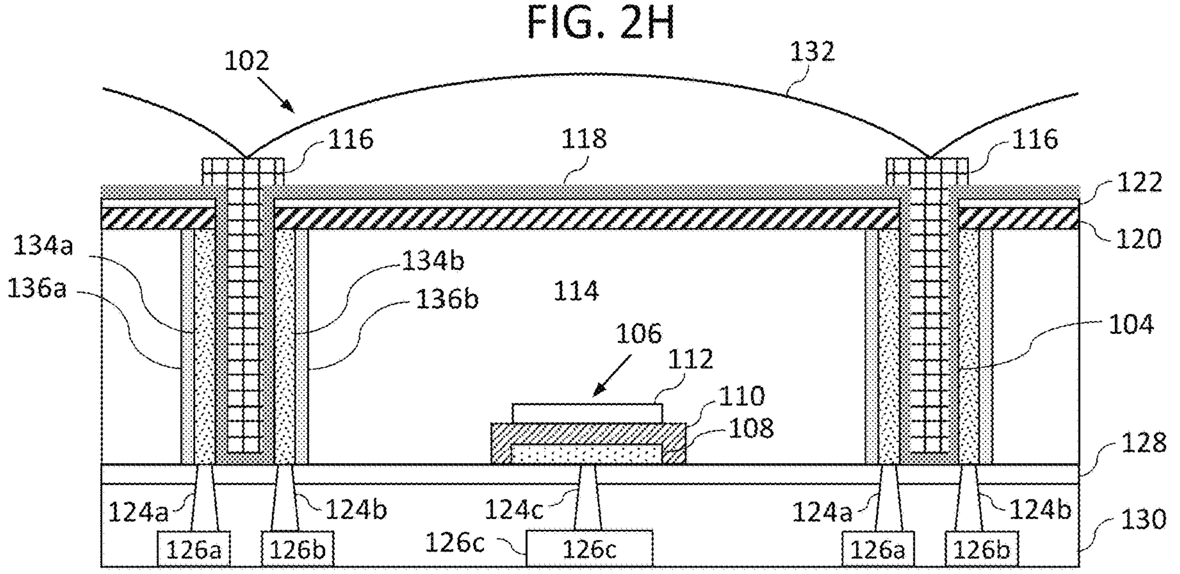

Material 116*a* is deposited to fill trenches 136 as shown in FIG. 2G. Examples of the material 116*a* are metal materials such as tungsten and copper, and doped semiconductor materials. When material 116*a* is a semiconductor material, the material may be doped by an in-situ doping process or a separate doping operation. The material 116*a* is etched using an etch mask to form the conductive material 116, thereby completing the DTI structures 104 as shown in FIG. 2H. Micro-lenses 132 are then formed over respective pixels 102 as shown in FIG. 2I.

Figure 3:
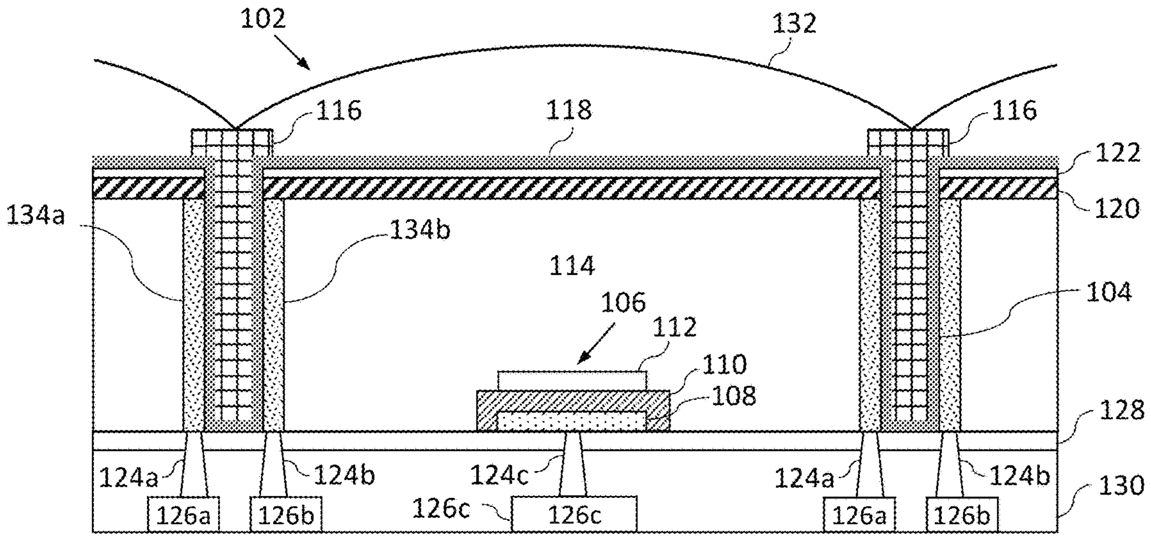
FIG. 3 illustrates a second embodiment of a photodiode.

FIG. 3 shows a second embodiment of a pixel 102 of a photodetector device 100. In the embodiment of FIG. 3, one end of first and second vertical conductive structures 134*a* and 134*b* are respectively coupled to first and second metal lines 126*a* and 126*b* through first and second contacts 124*a* and 124*b*, and the other end of the vertical conductive structures is coupled to conductive layer 120. Accordingly, vertical conductive structures 134 are anode pickups for a pixel 102. The process for forming the embodiment of FIG. 3 is similar to the process described above with respect to FIGS. 2A-2I, except that oxide liner layers 136 are not formed per the step illustrated in FIG. 2B The embodiment of FIG. 3 has several advantages compared to the embodiment of FIG. 1B. For example, the vertical conductive layers 134 of the embodiment in FIG. 3 can be thicker than the vertical conductive layers 134 of FIG. 1B using the same pixel size by enlarging the vertical conductive layers into the space that would otherwise be occupied by the oxide liner layers 136. Thicker vertical conductive layers 134 can reduce contact resistance to conductive layer 120 and to contacts 124, which can also be enlarged compared to the embodiment of FIG. 1B while maintaining the same pixel size. Alternatively, if the vertical conductive layers 134 in the embodiment of FIG. 3 are the same size as the vertical conductive layers 134 of the embodiment of FIG. 1B. the pixel size can be reduced by the thickness of the oxide liner layers, thereby increasing the pixel density of a photodetector device 100.

Figure 4:
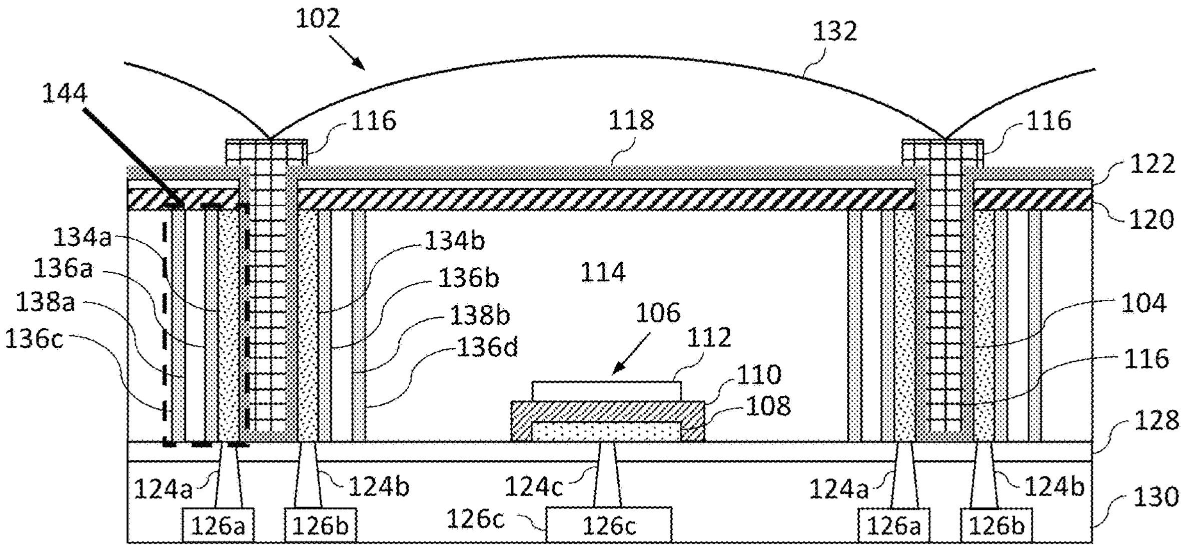
FIG. 4 illustrates a third embodiment of a photodiode including a Bragg reflector.

A third embodiment of a pixel 102 is illustrated by FIG. 4. In the third embodiment, a first vertical reflection layer 138*a* is disposed over the first oxide liner layer 136*a*, a second vertical reflection layer 138*b* is disposed over the second oxide liner layer 136*b*, a third oxide liner layer 136*c* is disposed over the first vertical reflection layer 138*a*, and a fourth oxide liner layer 136*d* is disposed over the second vertical reflection layer 138*b*. Light that enters the pixel partially reflects and refracts when it encounters each layer boundary, so collectively, layers 134, 136 and 138 form a Bragg reflector 144 within the pixel 102. The Bragg reflectors 144 suppress optical crosstalk within the pixel 102. Although layers 138*a* and 138*b* are referred to as reflection layers since they can at least partially reflect light, they are not necessarily formed of a purely reflective material, e.g. a metal material. It should be understood that the reflection layers 138 may be a material that both partially reflects and refracts light as explained above.

The materials of Bragg reflectors 144 are not particularly limited so long as each layer has a different refractive index from the adjacent layers. In one embodiment, the vertical layers 134 and 138 are polysilicon, and the oxide liner layers are silicon oxide. Of course, other materials are possible as known in the art. In addition, although the Bragg reflectors 144 in the embodiment of FIG. 4 have four layers, other embodiments can have a different number of layers, e.g. three layers, five layers or eight layers. The specific number of layers, materials, and thicknesses may be selected to provide desired performance characteristics. In some embodiments, thicknesses of the layers can range from less than 10 nm to over 100 nm depending on the processes, materials and the intended use of a photodetector device 100.

The Bragg reflectors may be formed using the same techniques described above. For example, the third and fourth oxide layers 136*c* and 136*d* may be formed by oxidizing sidewalls of a trench formed in semiconductor material 114. Subsequently, the base of the trench may be etched, and a second layer of semiconductor material may be formed over the entire structure. The second layer of semiconductor material may be removed from the base of the trench, and a second oxidation process may be performed to form first and second oxide layers 136*c* and 136*d* and first and second reflective layers 138*a* and 138*b* from a non-oxidized part of the second semiconductor material. Another etch process may be performed to remove material from the base of the trench, and the trenches may be filled with a conductive material 134 as illustrated in FIG. 2C.

Figure 5:
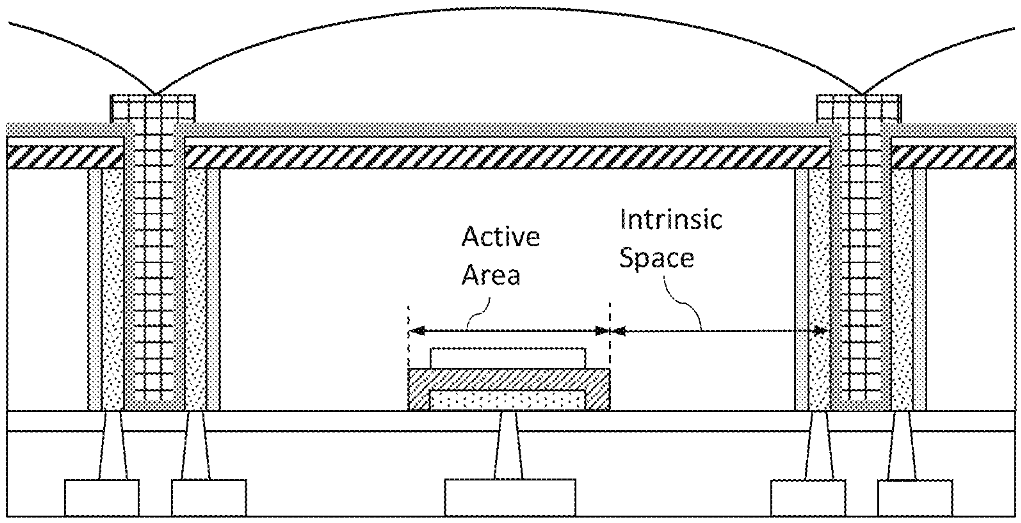
FIG. 5 illustrates active area and intrinsic space in a pixel of a photodiode device according to an embodiment.

Embodiments of the present disclosure have multiple advantages compared to conventional structures. FIG. 5 shows a device with an active area and an intrinsic space-the active area corresponds to the width of a diode structure 106, and the intrinsic space is the space between the active area and a DTI structure 104.

Because the embodiment in FIG. 5 does not have additional conductive structures located in the intrinsic space region of the pixels, it is possible to enlarge the active area while keeping the same intrinsic space of a conventional device. Increasing the active area increases the fill factor of a device, which improves the ability of a pixel to detect photons incident to the pixel area.

On the other hand, it is possible to shrink the size of the intrinsic space while maintaining the same active area. Reducing the intrinsic space decreases the size (pitch) of a pixel, leading to increased pixel density on a device. It is possible to adjust both the intrinsic space and active area individually or simultaneously to achieve one or both of a higher fill factor and a higher pixel pitch compared to a conventional device.

There is a tradeoff between pixel pitch and fill factor depending on the size of the active area and the intrinsic space. In embodiments of the present disclosure, photon detection probability is maintained or increased and dark current is not substantially degraded compared to conventional devices.

Figure 6:
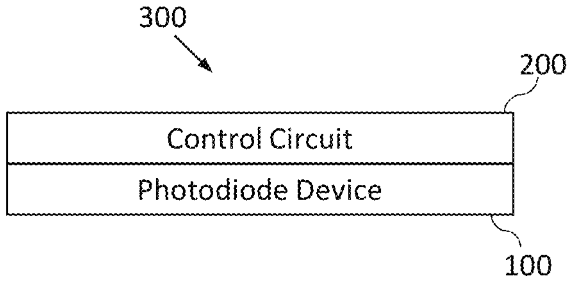
FIG. 6 illustrates a photodetector according to an embodiment.

FIG. 6 illustrates an embodiment of a photodetector 300. The photodetector 300 includes a photodiode device 100 according to an embodiment of the present disclosure, and a control circuit 200. The control circuit 200 may include circuitry to control operations of photodiode device 100 and to process signals received from the photodiode device 100. In an embodiment, the photodiode device 100 is coupled to control circuit 200 through metal lines 126, which may be part of the control circuit.

In some embodiments, the photodiode device 100 is on a separate die from the control circuit 200, and the dies may be stacked in a three-dimensional structure and/or coupled to control circuit 200 by an interposer substrate. Accordingly, the photodetector 300 in FIG. 6 may be embodied in various forms.

The resulting photodiode 100 is suitable for use in a variety of electronic devices, including imaging devices and focusing aides, optical devices including fiber-optic communication devices, cell phones, computer devices, security equipment, detection equipment including LiDAR, IoT and general household equipment, etc. The photodiode may be an avalanche photodiode or a single photon avalanche photodiode, for example.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

The invention claimed is:

1. A photodiode device, comprising:

a layer of semiconductor material;

a plurality of pixels, each of the pixels including a diode structure on a first side of the layer of semiconductor material and a conductive layer on a second side of the layer of semiconductor material;

deep trench isolation (DTI) structures isolating adjacent pixels from one another;

a first vertical conductive layer over a first side of each DTI structure; and a second vertical conductive layer over a second side of each DTI structure, wherein the first vertical conductive layer extends from the conductive layer to a first contact on the first side of each DTI structure, and the second vertical conductive layer extends from the conductive layer to a second contact on the second side of each DTI structure.

2. The photodiode device of claim 1, further comprising:

a first oxide liner layer over the first vertical conductive layer; and a second oxide liner layer over the second vertical conductive layer.

3. The photodiode device of claim 2, further comprising:

a first reflection layer over the first oxide liner layer;

a third oxide liner layer over the first reflection layer;

a second reflection layer over the second oxide liner layer; and a fourth oxide liner layer over the second reflection layer.

4. The photodiode device of claim 3, wherein the first vertical conductive layer, the first oxide liner, the first reflection layer, and the third oxide liner layer are at least a portion of a first Bragg reflector, and the second vertical conductive layer, the second oxide liner, the second reflection layer, and the fourth oxide liner layer are at least a portion of a second Bragg reflector.

5. The photodiode device of claim 1, wherein the semiconductor material of the layer of semiconductor material is epitaxial silicon.

6. The photodiode device of claim 1, wherein each of the first and second vertical conductive layers extend from the conductive layer to a base level of the DTI structures.

7. The photodiode device of claim 1, wherein the conductive layer is an electrode of the respective pixel.

8. The photodiode device of claim 1, wherein the photodiode device is a single-photon avalanche diode device.

9. A photodetector, comprising:

a photodiode device; and a control circuit configured to control an operation of the photodiode device, wherein the photodiode device includes:

a layer of semiconductor material;

a pixel including a diode structure on a first side of the layer of semiconductor layer and a conductive layer on a second side of the layer of semiconductor material;

a deep trench isolation (DTI) structure surrounding the pixel;

a first vertical conductive layer over a first side of the DTI structure; and a second vertical conductive layer over a second side of the DTI structure, wherein the first vertical conductive layer extends from the conductive layer to a first contact on the first side of each DTI structure, and the second vertical conductive layer extends from the conductive layer to a second contact on the second side of each DTI structure.

10. The photodetector of claim 9, wherein the photodiode device further comprises:

a first oxide liner layer over the first vertical conductive layer; and a second oxide liner layer over the second vertical conductive layer.

11. The photodetector of claim 10, wherein the photodiode device further comprises:

a first reflection layer over the first oxide liner;

a third oxide liner layer over the first reflection layer;

a second reflection layer over the second oxide liner; and a fourth oxide liner layer over the second reflection layer.

12. The photodetector of claim 11, wherein the first vertical conductive layer, the first oxide liner, the first reflection layer, and the third oxide liner layer are at least a portion of a first Bragg reflector, and the second vertical conductive layer, the second oxide liner, the second reflection layer, and the fourth oxide liner layer are at least a portion of a second Bragg reflector.

13. The photodetector of claim 9, wherein the semiconductor material of the layer of semiconductor material is epitaxial silicon.

14. The photodetector of claim 9, wherein each of the first and second vertical conductive layers extend from the conductive layer to a base level of the DTI structure.

15. The photodetector of claim 9, wherein the photodiode device is a single-photon avalanche diode device.

16. A method of forming a photodiode device including a plurality of pixels, the method comprising:

forming, on a substrate comprising a layer of conductive material and a layer of semiconductor material, a first vertical conductive layer and a second vertical conductive layer that extend through the layer of conductive material and the layer of semiconductor material;

forming a diode structure on a first side of the layer of semiconductor material; and forming a deep trench isolation (DTI) structure between the first and second vertical conductive layers, the DTI structure isolating the diode structure from an adjacent diode structure, wherein the first vertical conductive layer extends from the conductive layer to a first contact on the first side of the DTI structure, and the second vertical conductive layer extends from the conductive layer to a second contact on the second side of the DTI structure.

17. The method of claim 16, further comprising:

forming a first oxide liner layer; and forming a second oxide liner layer, wherein the first vertical conductive layer is formed over the first oxide liner layer, and the second vertical conductive layer is formed over the second oxide liner layer.

18. The method of claim 17, further comprising:

forming a first reflection layer;

forming a third oxide liner layer;

forming a second reflection layer; and forming a fourth oxide liner layer, wherein the first oxide liner layer is formed over the first reflection layer, the first reflection layer is formed over the third oxide layer, the second oxide liner layer is formed over the second reflection layer, and the second reflection layer is formed over the fourth oxide layer.

19. The method of claim 16, wherein the photodiode device is a single-photon avalanche diode device.

20. The method of claim 16, wherein each of the first and second vertical conductive layers extend from the conductive layer to a base level of the DTI structure.

* * * * *